(12) United States Patent
Zheng et al.

(10) Patent No.: US 8,747,686 B2
(45) Date of Patent: Jun. 10, 2014

(54) METHODS OF END POINT DETECTION FOR SUBSTRATE FABRICATION PROCESSES

(75) Inventors: Bo Zheng, Saratoga, CA (US); Mei Chang, Saratoga, CA (US); Arvind Sundarrajan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 49 days.

(21) Appl. No.: 13/360,633

(22) Filed: Jan. 27, 2012

(65) Prior Publication Data

US 2013/0193108 A1    Aug. 1, 2013

(51) Int. Cl.
*G01L 21/30* (2006.01)
*G01R 31/00* (2006.01)

(52) U.S. Cl.
USPC ........................................ 216/60; 156/345.25

(58) Field of Classification Search
USPC ........................................ 216/60; 156/345.25
See application file for complete search history.

(56) References Cited

U.S. PATENT DOCUMENTS

| | | | |
|---|---|---|---|
| 5,097,430 A | 3/1992 | Birang | |
| 5,986,747 A * | 11/1999 | Moran | ............................. 356/72 |
| 6,913,511 B2 | 7/2005 | Wiswesser et al. | |
| 7,048,837 B2 | 5/2006 | Somekh et al. | |
| 7,297,560 B2 * | 11/2007 | Yue | ................................... 438/9 |
| 7,329,328 B2 | 2/2008 | Gustafson et al. | |

OTHER PUBLICATIONS

Kuroi, Takashi et al. "Scaling of Shallow Trench Isolation with Stress Control for 65 nm Node and Beyond", IEEE Xplore. Feb. 2010. p. 548-553.

* cited by examiner

*Primary Examiner* — Roberts Culbert
(74) *Attorney, Agent, or Firm* — Patterson & Sheridan, LLP

(57) ABSTRACT

Methods and substrate processing systems for analyzing an end point of a process are provided. By-products of the process are detected and monitored to determine the completion of various types of reaction processes within a substrate processing chamber. The methods provide real time process monitoring, thereby reducing the need to rigidly constrain other substrate processing parameters, increasing chamber cleaning efficiency, and/or increasing substrate processing throughput.

24 Claims, 7 Drawing Sheets

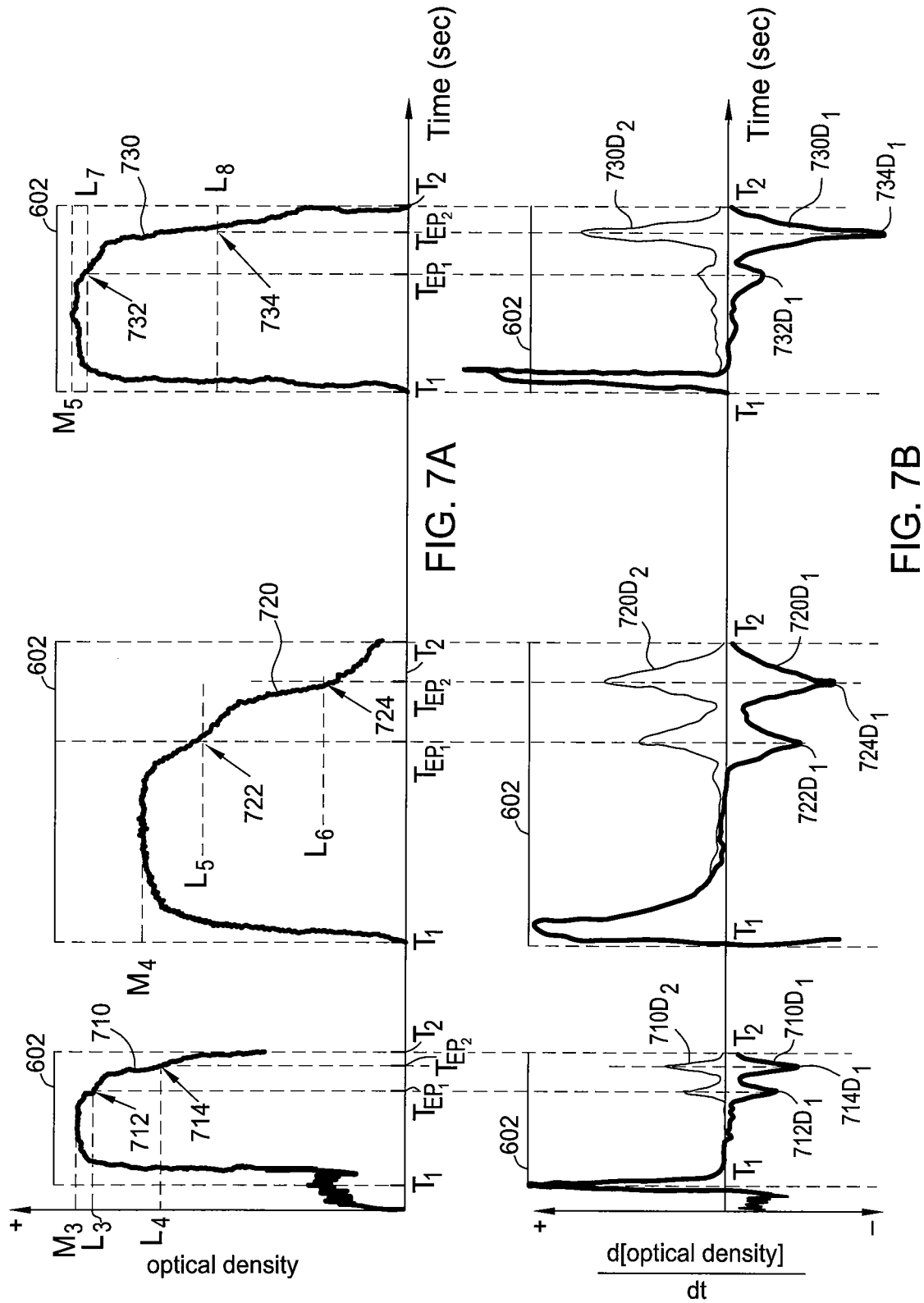

METHODS OF END POINT DETECTION FOR SUBSTRATE FABRICATION PROCESSES

BACKGROUND OF THE INVENTION

1. Field of the Invention

The invention generally relates to methods for forming semiconductor devices and more particularly relates to methods for processing a semiconductor substrate surface.

2. Description of the Related Art

In the field of integrated circuit and flat panel display fabrication, multiple deposition and etching processes are performed in sequence on the substrate within one or more processing chambers to form various design structures. Processes such as etching, physical vapor deposition (PVD), chemical vapor deposition (CVD), chamber cleaning and conditioning, etc. are well known in the industry and each process requires appropriate ways to detect the completion of the desired reaction inside a substrate processing chamber and cleaning of residue build-up on the substrate or the wall of the substrate processing chamber.

In general, silicon oxide, silicon nitride, metal oxide, or metal containing materials are deposited on the surface of a substrate as well as on all exposed surfaces in the substrate processing chamber. These materials may need to be etched or selectively removed in a subsequent process. In addition, these materials or residues may accumulate inside in the substrate processing chamber and must be removed from the chamber surfaces prior to the next deposition or etching process. Otherwise, the material may flake off and deposit on a substrate, thereby compromising the integrity of features formed thereon.

For example, an etch process can be used to remove materials from substrate surface. Plasma etch involves reacting a silicon-containing material on the surface of the substrate with a plasma to generate reaction intermediates as etchants and etch the silicon-containing material on the substrate surface. A requirement in such processes is a prompt termination of etching immediately after the first through, or clear, opening has been developed in the substrate. Stopping the etching process by a predetermined time is not practical because of the differences in film thickness on the surface of a wafer substrate and small surface area of active devices on a small portion of the substrate.

However, conventional end point detectors for plasma etch do not operate reliably during deep trench processes and when device surface areas are small. Such detectors focus a laser on the material to be etched and monitor the phase of the light reflected from the material. As the material is etched (removed), the phase of the reflected light changes in proportion with the depth of the etched area. In this manner, the detector monitors the etch depth and can cause the etching process to stop upon achieving a predetermined depth. To measure minute phase changes, the equipment must be accurately calibrated, and such equipment requires repeated recalibration. Also, as line widths become narrower, maintaining the laser focus upon a bottom of a trench is becoming difficult.

The second class of the end point detectors includes optical emission spectrometry (OES) detectors. These detectors comprise a data acquisition system and a plasma optical emission receiver and detect a change in intensity of one or several wavelengths of the plasma optical emission related to an etched or underlying layer. Sensitivity of these detectors diminishes with either complexity of spectrums or intensity of the plasma as the spectral lines of interest become obscured by background spectrum. Therefore, reliable and accurate end point detection which is critical during plasma etch remains an elusive goal.

On the other hand, pre-cleaning and removal of residual materials from substrate surface or chamber walls may use various chemical compounds that are ignited by exposure to plasma and react with the residual materials to form volatile compounds which can be exhausted from the chamber. Alternatively or additionally, such chemical compounds may form etching species which bombard chamber surfaces to dislodge residue from chamber components. During the time when the chamber cleaning operation is performed, the production of semiconductor devices cannot continue. As a result, the effective productivity of the chamber, as measured by substrate throughput, decreases significantly. To increase the chamber productivity, it is necessary to quickly finish the cleaning operation and restart the production promptly after the end of the cleaning operation. Therefore, it is imperative to precisely determine the end point of a cleaning process.

One method of detecting the end point of the cleaning process monitors a variation in a prescribed light wavelength emitted by the plasma. However, it is difficult to correctly detect the end point of the cleaning operation using this method because light emitted from lamps used to heat the substrate also heats, reacts with or otherwise affects the wavelength monitor, distorting the wavelength reading and resulting in over-cleaning or under-cleaning.

Another method of detecting the endpoint of a cleaning process is to observe the conditions within the chamber through a quartz view port. During processing within the chamber, residue accumulates on the view port, thereby blocking the view into the chamber. As the cleaning process progresses, the residual material is removed from the view port and all the other surfaces in the chamber as well, until the view port is clean and line of sight into the chamber is restored. Once line of sight into the chamber has been restored, the process is continued for approximately 20 to 30 seconds to ensure that the cleaning process is complete. The line of sight detection method does not provide an accurate determination of the endpoint and requires the use of cleaning time beyond the point in time when a clean view port is detected to assure adequate cleaning of the chamber.

In the area of integrated circuit fabrication, time spent in processing substrates and cleaning chambers is an important issue which manufacturers monitor. Time spent cleaning the chamber can be a factor limiting production capabilities. Accordingly, there is a need for a method which is accurate and consistent in determining the endpoint of a process performed inside a chamber. Preferably, the end point of a substrate removal or cleaning process can be determined by adapting existing hardware, monitors, and analyzers in a new process.

Therefore, there is a need for a novel end point detection method to be used for substrate processing or cleaning inside a substrate processing system. There is also a need for real time monitoring of substrate processing reactions or chamber cleaning efficiency.

SUMMARY OF THE INVENTION

Methods and systems for detecting end point prior to or during the formation of a material layer on a surface of a substrate or a chamber cleaning process are provided. In one embodiment, a method is provided to perform a process inside a substrate processing chamber for removing an oxide or metal oxide layer from a substrate surface or chamber walls.

In another embodiment, a substrate processing system having one or more substrate processing chambers are provided. The one or more substrate processing chambers may be etch chambers, cleaning chambers, CVD chambers, PVD chambers, ALD chambers, and combinations thereof. The substrate processing chamber generally includes a substrate support pedestal, one or more chamber walls, one or more holes on the one or more chamber walls to be connected to a space (e.g., a pressure cavity near a substrate processing space) above the substrate support pedestal, and an analyzer, connected to the one or more holes and capable of determining and monitoring a value of a property of a by-product of a process generated in the space inside the substrate processing chamber, concurrently while the process is performed within the substrate processing chamber and the by-product is generated, thereby detecting in real-time the end point of the process when the value of the property of the by-product decreases below a threshold limit.

In one aspect, pressure level within the pressure cavity is above 1 Torr. In another aspect, the threshold limit is determined when a maximum derivative value of the value of the property of the by-product is reached. In still another aspect, the process performed within the etch chamber may be silicon oxide removal processes, selective oxide removal processes, metal oxide removal processes, silicon nitride removal processes, and combinations thereof.

In still another embodiment, a method for determining the completion of a process and analyzing an end point of the process performed within a substrate processing chamber includes performing the process to remove a material from an interior portion of the substrate processing chamber, wherein the process generates a by-product and detecting the by-product in a space (e.g., a pressure cavity) near a support pedestal disposed in the interior portion of the substrate processing chamber concurrently while the process is being performed. In addition, a value of a property of the by-product is monitored and the end point of the process is determined when the value of the property of the by-product decreases below a threshold limit, which is determined when a maximum derivative value of the value of the property of the by-product is reached. In one aspect, the by-product generated in the space near the substrate and the support pedestal is directed to an analyzer coupled to the substrate processing chamber to determine and monitor the value of the property (e.g., optical densities, electrical fields, mass, fluorescence, and plasma emission, among others.) of the by-product. In another aspect, the by-product is water (e.g., ionized or gaseous water vapor)

In yet another embodiment, a method for analyzing an end point of an etching process performed inside an etch chamber includes detecting the generation of a by-product of the process in a space inside the etch chamber during the process performed to remove a material from a surface of a substrate disposed above a support pedestal, and monitoring a value of a property of the by-product. The method further includes determining the end point of the process by an analyzer coupled to the etch chamber when the value of the property of the by-product decreases below a threshold limit. In one aspect, the threshold limit is determined when a maximum derivative value of the value of the property of the by-product is reached.

In still another embodiment, a method for analyzing an end point of an oxide removal process performed within a substrate processing chamber is provided. The method includes performing the oxide removal process to remove an oxide-containing material layer from a surface of a substrate disposed above a support pedestal in an interior portion of the substrate processing chamber, wherein the oxide removal process generates a water by-product, detecting the water by-product in a space near the support pedestal disposed in the interior portion of the substrate processing chamber concurrently while the oxide removal process is being performed, and monitoring a value of a property of the water by-product generated during the oxide-removal process. The method further includes determining end points of the oxide removal process when the value of the property of the by-product decreases below a threshold limit.

In one aspect, a first end point for the completion of the removal of a first thickness of the oxide-containing material layer is determined when the value of the property of the water by-product decreases below a first threshold limit. The first threshold limit is determined at the time when a first maximum derivative value of the value of the property of the water by-product is reached; indicating the first thickness of the oxide-containing material layer is removed from the surface of the substrate. In another aspect, a second end point for the completion of the removal of a second thickness of the oxide-containing material layer is determined when the value of the property of the water by-product decreases below a second threshold limit, wherein the second thickness is initially thicker than the first thickness. The second threshold limit is determined at the time when a second maximum derivative value of the value of the property of the water by-product is reached; indicating the second thickness of the oxide-containing material layer is completely removed from the surface of the substrate.

BRIEF DESCRIPTION OF THE DRAWINGS

So that the manner in which the above recited features are implemented and can be had by reference to embodiments, some of which are illustrated in the appended drawings. To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments and are therefore not to be considered limiting of its scope and may admit to other equally effective embodiments.

FIG. 7A shows the results of a method of analyzing an end point of a process by plotting the values of a property (e.g., optical density) of a by-product generated during the process performed inside a substrate processing chamber versus time (in seconds).

FIG. 7B shows three exemplary plots of performing a derivative analysis on the values of the optical densities of the by-product generated during the process of FIG. 7B.

DETAILED DESCRIPTION

Embodiments provide methods for end point detection during substrate fabrication, material removal, and/or chamber cleaning processes. Substrate processing systems adapted for such methods are also provided. In one embodiment, precisely detection and determination of the end point (EP) of a chamber cleaning process or material removal process is provided. In another embodiment, the end point of a material deposition or etch process performed on the surface of a substrate inside a substrate processing chamber is provided.

On embodiment of the invention provides a substrate processing system that includes one or more substrate processing chambers connected to one or more analyzers to perform an end point detection method. As will be described in detail below, conventional hardware monitors, and analyzers can be adjusted and/or combined with additional mechanical parts to perform the methods described.

Another embodiment provides a method of real-time monitoring of substrate processing reactions and/or chamber cleaning efficiency. The progress of substrate fabrication processes, various material deposition processes, various etching reactions, various chamber cleaning reactions, and various types of reactions inside a substrate processing chamber can be monitored until an end point is reached and these processes and reactions can be terminated by a control system coupled to the substrate processing chamber.

The term "substrate" as used herein refers to a layer of material that serves as a basis for subsequent processing operations and includes a surface to be cleaned or processed for depositing or removing a material layer thereon. For example, the substrate can include one or more conductive metals, such as aluminum, copper, tungsten, or combinations thereof. The substrate can also include one or more nonconductive materials, such as silicon, silicon oxide, doped silicon, germanium, gallium arsenide, glass, and sapphire. The substrate can also include dielectric materials such as silicon dioxide, organic silicates, and carbon doped silicon oxides. Further, the substrate can include any other materials such as metal nitrides and metal alloys, depending on the application. In one or more embodiments, the substrate can form a gate structure including a gate dielectric layer and a gate electrode layer to facilitate connecting with an interconnect feature, such as a plug, via, contact, line, and wire, subsequently formed thereon.

Moreover, the substrate is not limited to any particular size or shape. The substrate can be a round wafer having a 200 mm diameter or a 300 mm diameter. The substrate can also be any polygonal, square, rectangular, curved or otherwise non-circular w-piece, such as a polygonal glass substrate used in the fabrication of flat panel displays.

Figure 1A:
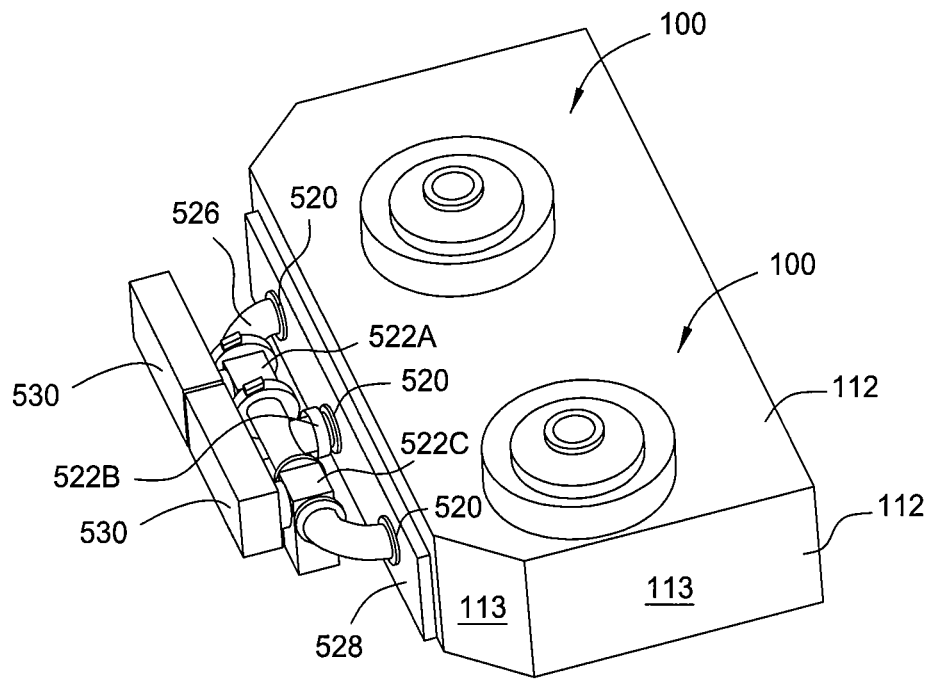
FIG. 1A is a top oblique view of two exemplary substrate processing chambers connected together and coupled to two analyzers.

FIG. 1A is a top view of two exemplary substrate processing chambers connected together and coupled to two analyzers. In general, a substrate processing chamber 100 is connected to an analyzer 530 through one or more holes 520 and one or more fluid lines 526. The substrate processing chamber 100 may optionally provide a chamber viewing window 528. Gases, fluids, reactions precursors, reaction products and reaction by-products can be flowed from the substrate processing chamber 100 through the holes 520 into the fluid lines 526, which are connected to one or more analyzers 530. One or more valves 522A, 522B, 522C can be used to control the flow of the fluids which are flowing inside the fluid lines 526 and delivered to the analyzer 530.

Figure 1B:
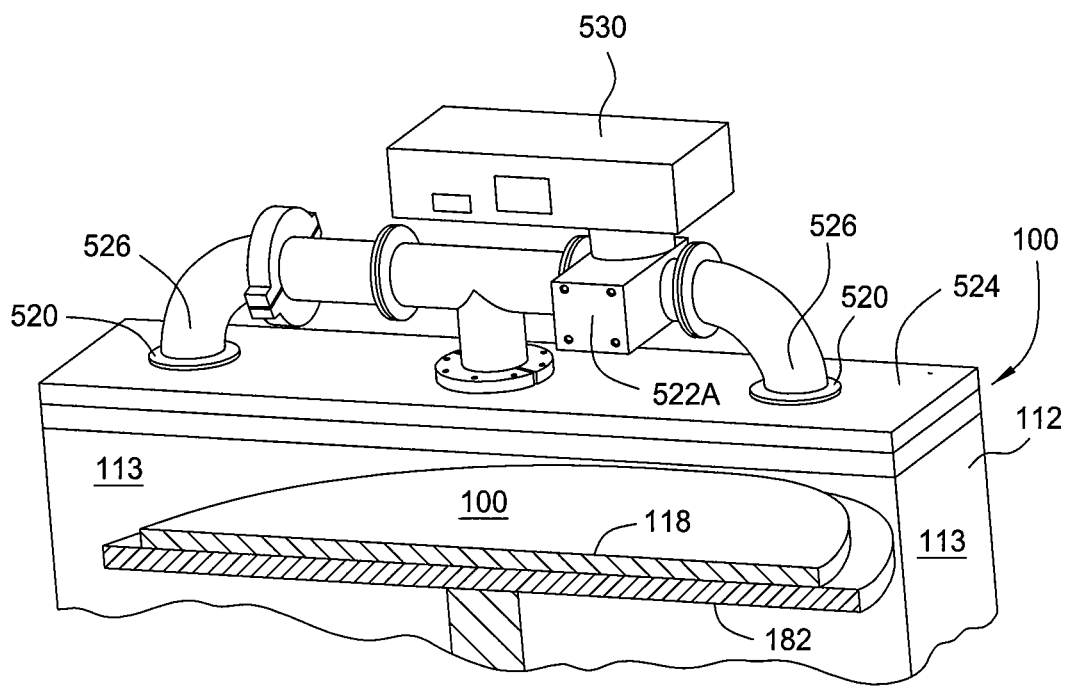
FIG. 1B is a side view of a portion of another embodiment of an exemplary substrate processing chamber coupled to one exemplary analyzer.

FIG. 1B demonstrate another example of a substrate processing chamber 100 coupled to one example of an analyzer 530. The substrate processing chamber 100 generally includes a chamber body 112 and a substrate support pedestal 182 disposed inside the substrate processing chamber 100. The chamber body 112 is formed into one or more chamber walls 113 and at least one of the chamber walls 113 contains one or more holes 520 for connecting to the analyzer 530 via one or more fluid lines 526.

The substrate support pedestal 182 includes a substrate supporting surface 118 for supporting a substrate thereon during substrate processing. The one or more holes 520 can be positioned on any one of the one or more chamber walls 113 to be connected to a space 110 (e.g., a substrate processing space) into another space (e.g., a pressure cavity 129 near the substrate processing space) above the substrate support pedestal near the substrate support pedestal 182 (shown in FIG. 3). In general, by-products of a reaction or a process performed within the substrate processing chamber 100 are generated in the space 110 located near or above the substrate supporting surface 118. The by-products of the process performed within the substrate processing chamber 100 is directed to flow into the pressure cavity 129 disposed near the space 110, but separated from the space 110. In one embodiment, the pressure level within the pressure cavity is above 1 Torr.

Figure 3:
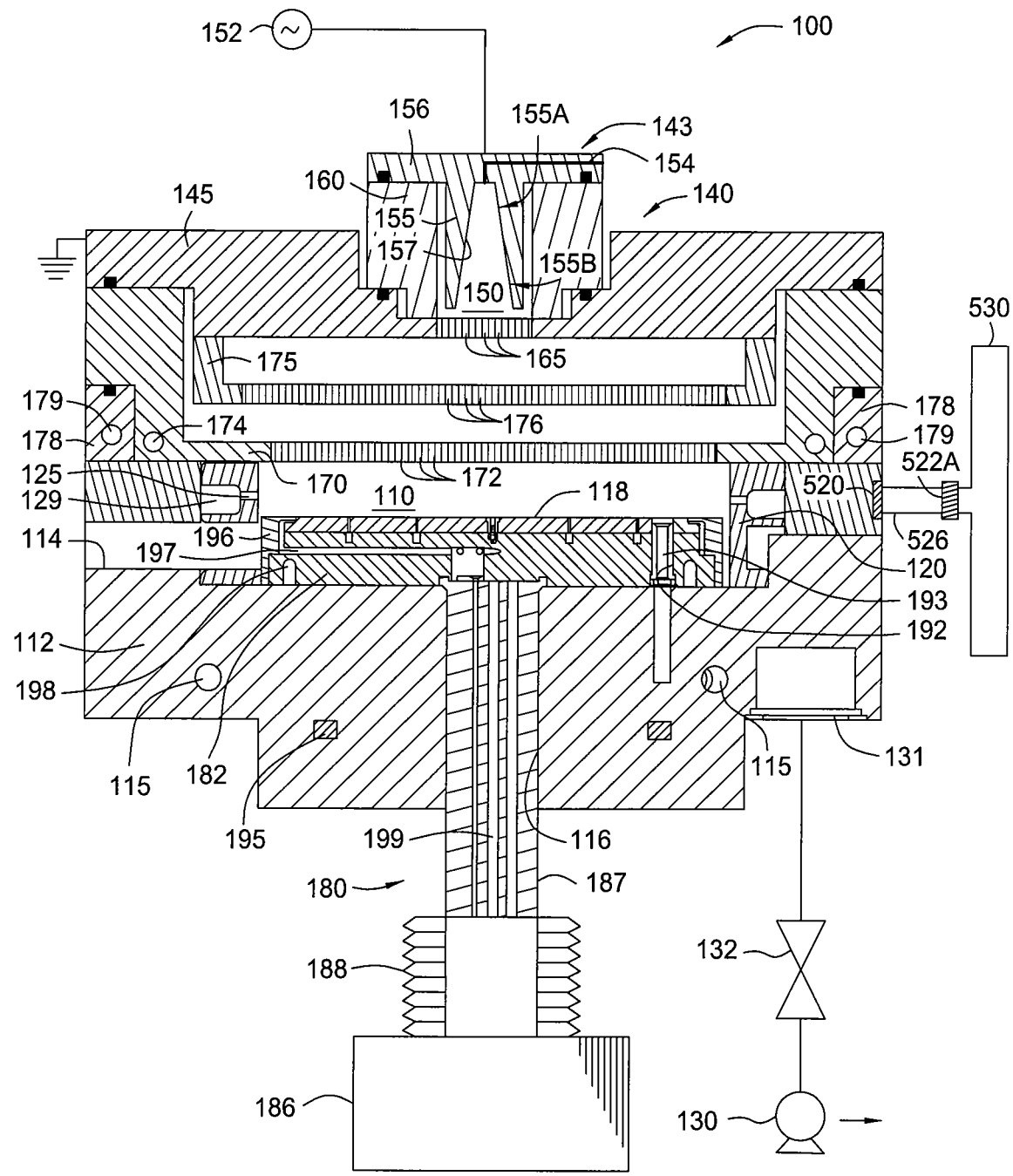
FIG. 3 is a cross sectional view of a substrate processing chamber.

It is contemplated that connecting an analyzer directly near the substrate processing space (e.g., the space 110) would interfere with the process performed inside the substrate processing chamber 100 and thus is not desirable. One embodiment of the invention provides that the analyzer 530 is coupled to a pressure cavity (e.g., a pressure cavity 129 near the substrate processing space, as shown in FIG. 3), via the one or more holes 520, such that real-time monitoring of the generation of the by-products of a process performed inside the substrate processing chamber 100 can be performed without interfering substrate processing therein.

In one embodiment, an adapter 524 is used to couple the analyzer 530 to the substrate processing chamber 100. The adapter 524 is adjusted to engage onto one of the chamber walls 113 and align the holes 520 with the one or more fluid lines 526. In one aspect, the adapter 524 is capable of engaging and aligning with existing chamber hardware. For example, the adapter 524 can be used to couple the analyzer 530 with the holes 520 located on the one or more chamber walls 113. As another example, the adapter 524 can be used to couple the analyzer 530 with the chamber viewing window 528 located on the one or more chamber walls 113 of the substrate processing chamber 100. Accordingly, the coupling and adaptation of a suitable analyzer to various types of substrate processing chambers is simple to set up and easily integrated.

In another embodiment, an end point detection method can be performed by adapting existing hardware to any types of substrate processing chambers. For example, suitable substrate processing chamber 100 include etch chambers, substrate cleaning chambers, CVD chambers, PVD chambers, ALD chambers, and combinations thereof.

Another embodiment provides a multiple-chamber substrate processing system having two or more suitable substrate processing chambers coupled together. For example, one or more substrate processing chambers within a multiple-chamber substrate processing system can be coupled to one, two or any number of the analyzers 530 for detecting an end point of a process performed therein. As another example, a single analyzer may be couple to two or more substrate processing chambers that are performing similar substrate fabrication or chamber cleaning processes, thereby increase the throughput of the multiple-chamber substrate processing system.

Figure 2:
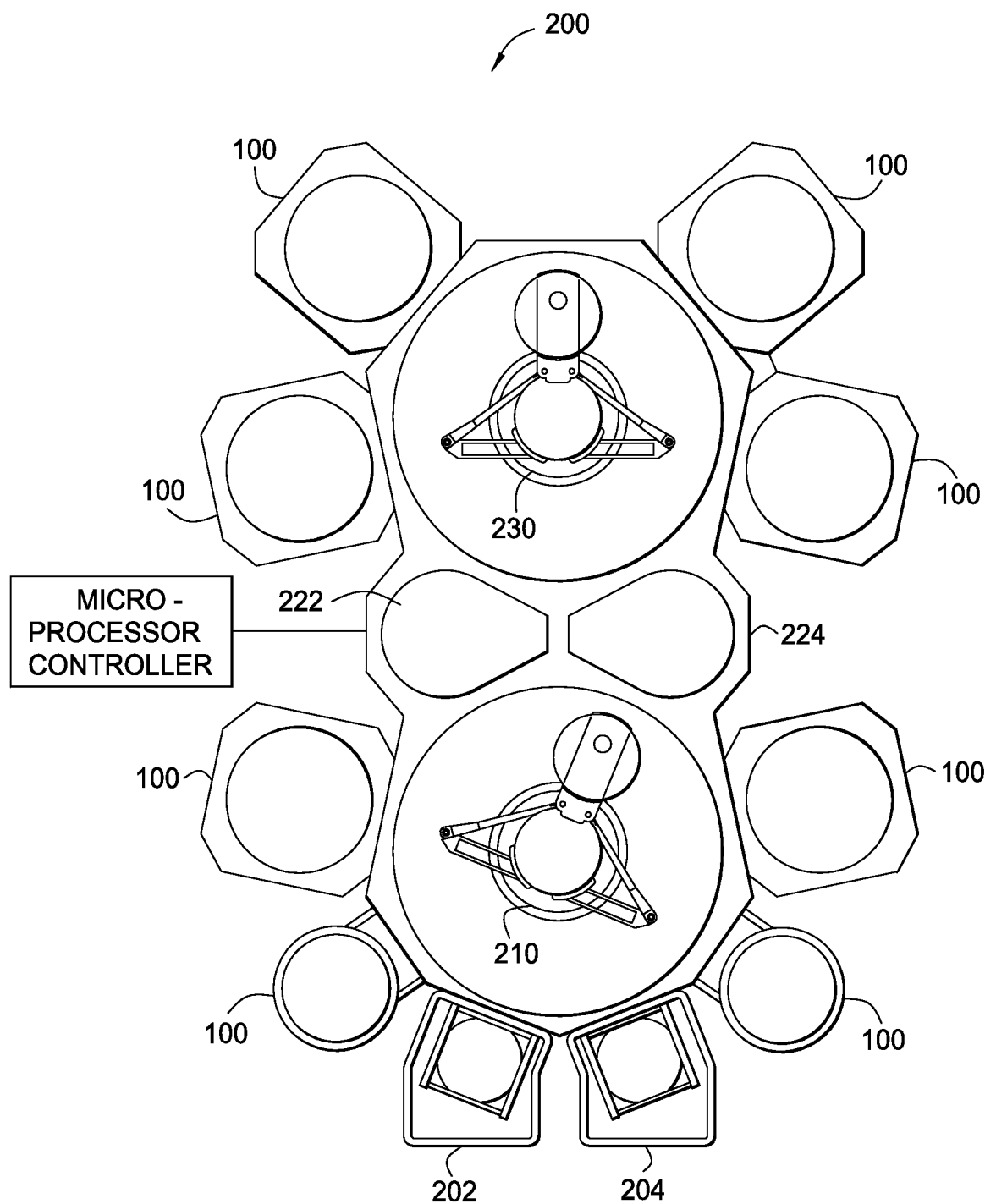
FIG. 2 is a schematic top-view of a multi-chamber processing system.

FIG. 2 is one example of a multi-chamber processing system 200 that can be adapted to perform one or more processes as disclosed herein. The multi-chamber processing system 200 having one or more substrate processing chamber 100 coupled thereto can include one or more load lock chambers 202, 204 for transferring substrates into and out of the system 200. Typically, since the multi-chamber processing system 200 is under vacuum, the load lock chambers 202, 204 can "pump down" the substrates introduced into the multi-chamber processing system 200.

A first robot 210 can transfer the substrates between the load lock chambers 202, 204, and a first set of one or more substrate processing chambers 100 (a first set of four chambers are shown in FIG. 2). Each substrate processing chamber 100 is configured to perform at least one of substrate processing operations, such as cyclical layer deposition (CLD), atomic layer deposition (ALD), chemical vapor deposition (CVD), physical vapor deposition (PVD), etch, degas, orientation, chamber cleaning and other substrate fabrication processes. The position of the substrate processing chamber 100 relative to the other chambers in FIG. 2 is provided for illustration purpose, and the position of the substrate processing chamber 100 may be optionally switched with any one of the substrate processing chambers 100 if desired.

The first robot 210 can also transfer substrates to/from one or more transfer chambers 222, 224. The transfer chambers 222, 224 can be used to maintain ultrahigh vacuum conditions while allowing substrates to be transferred within the system 200. A second robot 230 is used to transfer the substrates between the transfer chambers 222, 224 and a second set of one or more substrate processing chambers 100 (a second set of four chambers are shown in FIG. 2). Similar to the first set of substrate processing chambers 100, the second set of the substrate processing chambers 100 can be outfitted to perform a variety of substrate processing operations including the dry etch processes, wet etch process, cyclical layer deposition (CLD), atomic layer deposition (ALD), chemical vapor deposition (CVD), physical vapor deposition (PVD), precleaning, substrate treatment, degas, and orientation, for example. Any of the substrate processing chambers 100 can be removed from the multi-chamber processing system 200 if not necessary for a particular process to be performed by the multi-chamber processing system 200. After a process is performed in the substrate processing chamber 100, the substrate may further be transferred to any of the other substrate processing chambers 100 disposed in the multi-chamber processing system 200 to perform other processes.

FIG. 3 is a cross sectional view of one example of a substrate processing chamber 100 suitable for conducting an oxide removal process as further described below. The substrate processing chamber 100 may be configured to remove native oxides, silicon oxides, metal oxides, or other contaminants from a surface of a substrate prior to (e.g., a substrate pre-clean process) or after (e.g., a substrate treatment process) the formation of a material layer on the surface of the substrate. The substrate processing chamber 100 is particularly useful for performing a plasma-assisted dry etch process. The substrate processing chamber 100 may be a Preclean PCII, PCXT or Siconi chambers which are available from Applied Materials, Santa Clara, Calif. It is noted that other vacuum chambers available from other manufactures may also be utilized to practice the present invention.

The substrate processing chamber 100 includes a chamber body 112, a lid assembly 140, and a support assembly 180. In addition, the substrate support pedestal 182 having the substrate support surface 118 is disposed inside the substrate processing chamber 100. The chamber body 112 includes one or more chamber walls 113 and at least one of the chamber walls 113 contains one or more holes 520 for connecting to the analyzer 530 via the fluid line 526. Gases, fluids, and reaction by-products can flow out of the substrate processing chamber 100 via the hole 520 and the fluid line 526 into the analyzer 530. The delivering of various by-products of a process performed near the space 110 of the substrate processing chamber 100 is controlled by the valve 522A.

The chamber body 112 further includes a slit valve opening 114 formed in a sidewall thereof to provide access to the interior of the substrate processing chamber 100. The slit valve opening 114 is selectively opened and closed to allow access to the interior of the chamber body 112 by a wafer handling robot (not shown). The chamber body 112 further includes a channel 115 formed therein for flowing a heat transfer fluid therethrough. The heat transfer fluid can be a heating fluid or a coolant and is used to control the temperature of the chamber body 112 during substrate processing and transfer. The temperature of the chamber body 112 is important to prevent unwanted condensation of the gas or byproducts on the chamber walls. Exemplary heat transfer fluids include water, ethylene glycol, or a mixture thereof. An exemplary heat transfer fluid may also include nitrogen gas.

In one or more embodiments, the chamber walls 113 of the chamber body 112 includes at least one hole 520 positioned to be connected to one or more analyzers 530. Any materials, fluids, gaseous materials or by-products of a process performed within the substrate processing chamber 100 can flow through the holes 520 into the fluid lines 526. The valve 522A can be used to adjust the flow of the materials, fluids, gaseous materials and by-products generated within the substrate processing chamber 100 that flow to the analyzer 530.

The lid assembly 140 is disposed at an upper end of the chamber body 112, and the support assembly 180 is at least partially disposed within the chamber body 112. The chamber body 112 can include a liner 120 to surround the support assembly 180. The liner 120 is removable for servicing and cleaning. The liner 120 can be made of a metal such as aluminum, a ceramic material, or any other process compatible material. The liner 120 can be bead blasted to increase surface roughness and/or surface area which increases the adhesion of any material deposited thereon, thereby preventing flaking of material which results in contaminants of the processing chamber 100. The liner 120 includes one or more apertures 125 and the pressure cavity 129 formed therein.

In one embodiment, the analyzer 530 can be connected to the substrate processing chamber 100 via the apertures 125 and the pressure cavity 129. The apertures 125 provide a flow path for gases to flow into the pumping cavity 129, which provides an egress for the gases within the substrate processing chamber 100. For example, the by-products of the process performed within the substrate processing chamber 100 are directed to flow into the pressure cavity 129 disposed near the space 110, but separated from the space 110 by the liner 120, where the pressure level within the pressure cavity 129 is generally in the range of Torr, such as above 1 Torr.

The substrate processing chamber 100 can further include a vacuum pump 130 and a throttle valve 132 to regulate flow of gases passing through in and out of the substrate processing chamber 100. The vacuum pump 130 is coupled to a vacuum port 131 disposed on the chamber body 112 and a fore-line 133 connected to the throttle valve 132. The terms "gas" and "gases" are used interchangeably, unless otherwise noted, and refer to one or more precursors, reactants, catalysts, carrier, purge, cleaning, combinations thereof, as well as any other fluid introduced into the chamber body 112.

Conventional end point detection may use an analyzer connected to an exhaust line, as the vacuum port 131 and the fore-line 133. The exhaust line is generally connected to a vacuum system (e.g., the vacuum pump 130). As a result, the pressure level within the exhaust line or fore-line 133 is really low (in the range of milliTorr), such that the gas atoms within the exhaust line are very much apart from each other. It is, therefore, difficult to detect and monitor the level of gases, reaction products or by-products near the exhaust line by a gas analyzer. The gas analyzer needs to be very sensitive to detect the levels of any gases flowing in the exhaust line.

The lid assembly 140 includes at least two stacked components configured to form a plasma volume or cavity therebetween, a first electrode 143 ("upper electrode") disposed vertically above a second electrode 145 ("lower electrode") confining a plasma volume or cavity 150 therebetween. The first electrode 143 is connected to a power source 152, such as an RF power supply, and the second electrode 145 is connected to ground, forming a capacitance between the two electrodes 143, 145. The first electrode 143 may have an expanding section 155 that houses the plasma cavity 150. The expanding section 155 may be an annular member with an inner surface or diameter 157 that gradually increases from an upper portion 155A thereof to a lower portion 155B thereof. As such, the distance between the first electrode 143 and the second electrode 145 can be variable. The varying distance helps control the formation and stability of the plasma generated within the plasma cavity 150. The expanding section 155 may resemble an inverted cone or "funnel." The inner surface 157 of the expanding section 155 may gradually slope from the upper portion 155A to the lower portion 155B of the expanding section 155. The slope or angle of the inner diameter 157 can vary and the length or height of the expanding section 155 can also vary, depending on specific process requirements and/or limitations. Although not shown, two gas inlets 154 can be disposed at opposite sides of the expanding section 155 to create a swirling flow pattern or "vortex" flow into the expanding section 155 which helps mix the gases within the plasma cavity 150.

The lid assembly 140 may further include one or more gas inlets 154 (only one is shown) that are at least partially formed within an upper section 156 of the first electrode 143. One or more process gases enter the lid assembly 140 via the one or more gas inlets 154, which are in fluid communication with the plasma cavity 150 at a first end thereof and coupled to one or more upstream gas sources and/or other gas delivery components, such as gas mixers, at a second end thereof. The lid assembly 140 may further include an isolator ring 160 to electrically isolate the first electrode 143 from the second electrode 145.

The lid assembly 140 can further include a distribution plate 170 and a blocker plate 175 adjacent the second electrode 145. The second electrode 145, distribution plate 170 and blocker plate 175 can be stacked and disposed on a lid rim 178 which is connected to the chamber body 112. The lid rim 178 can include an embedded channel or passage 179 for housing a heat transfer medium used for heating, cooling, or both, depending on the process requirements. The second electrode or top plate 145 can include a plurality of gas passages or apertures 165 formed beneath the plasma cavity 150 to allow gas from the plasma cavity 150 to flow therethrough. The apertures 172 can be sized and positioned about the distribution plate 170 to provide a controlled and The distribution plate 170 may include one or more embedded channels or passages 174 for housing a heater or heating fluid to provide temperature control of the lid assembly 140. A resistive heating element (not shown) can be inserted within the passage 174 to heat the distribution plate 170. A thermocouple can be connected to the distribution plate 170 to regulate the temperature thereof. The thermocouple can be used in a feedback loop to control electric current applied to the heating element, as described above. Any heat transfer medium may be used, such as nitrogen, water, ethylene glycol, or mixtures thereof, for example.

The blocker plate 175 can be optionally disposed between the second electrode 145 and the distribution plate 170 and/or removably mounted to a lower surface of the second electrode 145. The blocker plate 175 may include a plurality of apertures 176 to provide a plurality of gas passages from the second electrode 145 to the distribution plate 170. The apertures 176 can be sized and positioned about the blocker plate 175 to provide a controlled and even flow distribution to the distribution plate 170.

The support assembly 180 includes the substrate support pedestal 182 having the substrate supporting surface 118 to support a substrate (not shown in this view) for substrate processing within the substrate processing chamber 100. The substrate support pedestal 182 can be coupled to a lift mechanism 186 through a shaft 187 which extends through a centrally-located opening 116 formed in a bottom surface of the chamber body 112. The lift mechanism 186 can be flexibly sealed to the chamber body 112 by a bellows 188 that prevents vacuum leakage from around the shaft 187. The lift mechanism 186 allows the substrate support pedestal 182 to be moved vertically within the chamber body 112 between a process position and a lower transfer position. The transfer position is slightly below the opening of the slit valve opening 114 formed in a sidewall of the chamber body 112.

The substrate support pedestal 182 can include a removable top plate 190 made of some other material, such as silicon or ceramic material, for example, to reduce backside contaminants of the substrate. A substrate (not shown) may be secured to the substrate support pedestal 182 using a vacuum chuck, an electrostatic chuck or other mechanisms. The substrate support pedestal 182 can include one or more bores 192 formed therethrough to accommodate a lift pin 193. Each lift pin 193 is constructed of ceramic or ceramic-containing materials, and used for substrate handling and transport.

The support assembly 180 can further include an edge ring 196 disposed about the substrate support pedestal 182 and adapted to cover an outer perimeter of the substrate support pedestal 182 and protect the substrate support pedestal 182 from deposition. An annular purge gas channel can be in fluid communication with a purge gas conduit 197 formed through the substrate support pedestal 182 and the shaft 187. The purge gas conduit 197 is in fluid communication with a purge gas supply (not shown) to provide a purge gas to the purge gas channel. Any suitable purge gas such as nitrogen, argon, or helium, may be used alone or in combination. In operation, the purge gas flows through the conduit 197, into the purge gas channel, and about an edge of the substrate disposed on the substrate support pedestal 182. Accordingly, the purge gas working in cooperation with the edge ring 196 prevents deposition at the edge and/or backside of the substrate.

The temperature of the support assembly 180 can be controlled by a fluid circulated through a fluid channel 198 embedded in the body of the substrate support pedestal 182. The fluid channel 198 may be in fluid communication with a heat transfer conduit 199 disposed through the shaft 187 of the support assembly 180. The fluid channel 198 is positioned about the substrate support pedestal 182 to provide a uniform heat transfer to the substrate receiving surface of the substrate support pedestal 182. The fluid channel 198 and heat transfer conduit 199 can flow heat transfer fluids to either heat or cool the substrate support pedestal 182. Any suitable heat transfer fluid may be used, such as water, nitrogen, ethylene glycol, or mixtures thereof. The substrate support pedestal 182 can further include an embedded thermocouple (not shown) for monitoring the temperature of the support surface of the substrate support pedestal 182. For example, a signal from the thermocouple may be used in a feedback loop to control the temperature or flow rate of the fluid circulated through the fluid channel 198.

A system controller (not shown) can be used to regulate the operations of the substrate processing chamber 100 and the performance of an end point detection method described herein. The system controller can operate under the control of a computer program stored in the memory of a computer. The computer program may include instructions that enable any of the process described herein to be performed within the substrate processing chamber 100. For example, the computer program can dictate the process sequencing and timing, detection of reaction by-products, monitoring a substrate fabrication process, providing a mixture of gases, chamber pressures, RF power levels, susceptor positioning, slit valve opening and closing, wafer cooling, determination of a process end-point, termination of a process, and other parameters of a particular process.

Figure 4:
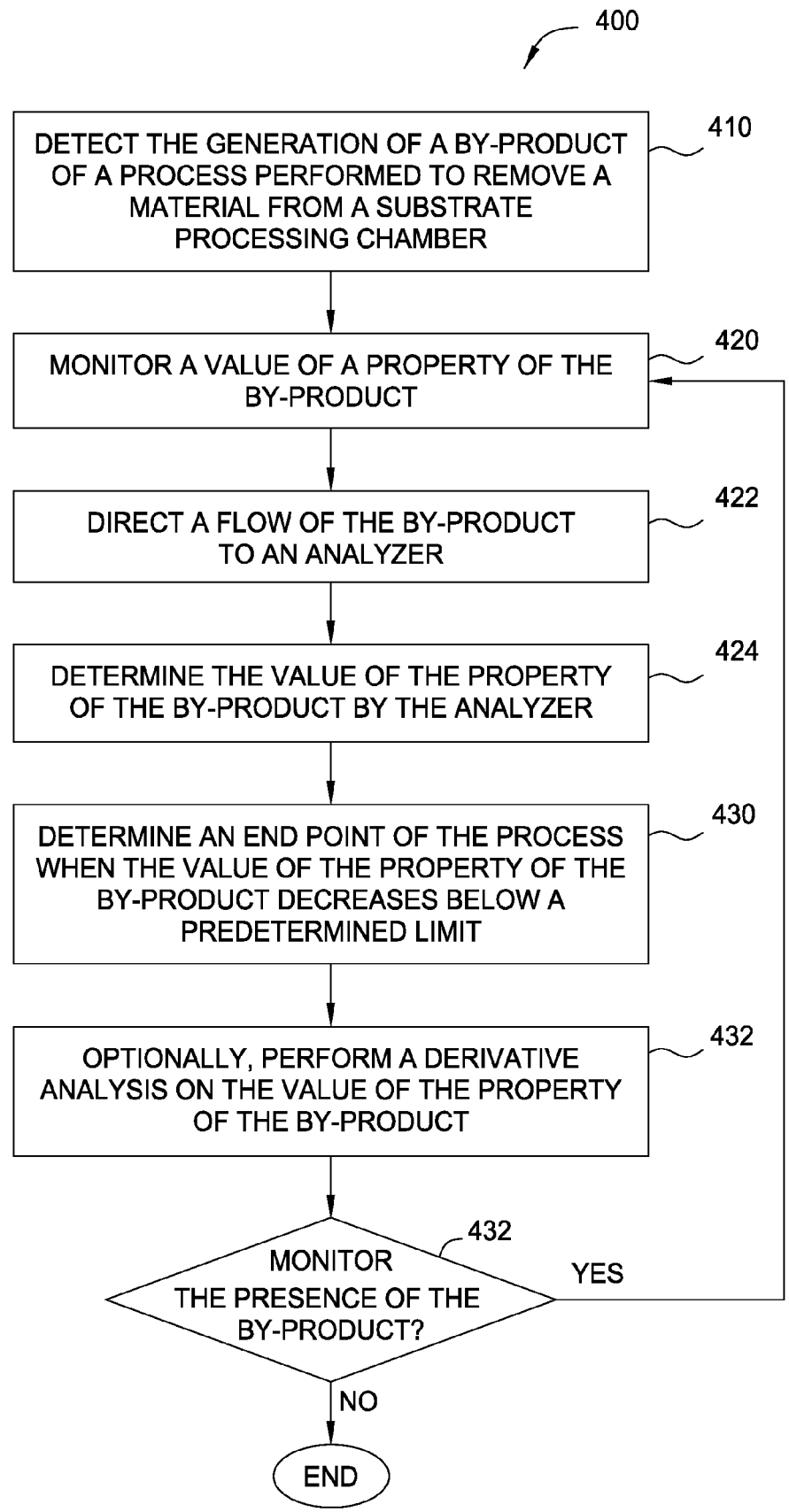
FIG. 4 is a flow diagram for a method of detecting an end point of a process.

FIG. 4 illustrates the steps of a method 400 used to analyze an end point of a process performed inside a substrate processing chamber 100. At step 410, the generation of a by-product of a process performed to remove a material from a substrate processing chamber is detected. The detection of the generation of the by-products can be performed by any suitable means, including observation by naked eyes, observation through a viewing window (e.g., the chamber viewing window 528 in FIG. 3), detection by an analyzer connected to the substrate processing chamber (e.g., the analyzer 530 connected to the substrate processing chamber 100 in FIGS. 1A-1B, 2, and 3), among others. In one embodiment, an analyzer is connected to the substrate processing chamber to detect the generation of the by-product.

In one example, a process is performed inside a substrate processing chamber to remove a material, including silicon, silicon oxide, silicon nitride, metal oxide, and combinations thereof, from a surface of a substrate. For example, the substrate may contain a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate may have various dimensions, such as 200 mm or 300 mm diameter wafers, as well as, rectangular or square panels. Unless otherwise noted, embodiments and examples described herein are conducted on substrates with a 200 mm diameter or a 300 mm diameter.

In another example, a process is performed inside the substrate processing chamber to remove silicon, silicon oxide, silicon nitride, metal oxide, and other materials from a substrate processing space (e.g., the space 110 in FIG. 3) near a substrate support (e.g., the substrate support pedestal 182 in FIG. 3) during chamber cleaning or substrate fabrication processing.

At step 420, a value of a property of the by-product generated during a process performed inside a substrate processing chamber is monitored. The method 400 may further include, at step 422, directing a flow of the by-product generated in the substrate processing space near a support pedestal inside a process chamber to an analyzer (e.g., the analyzer 530 in FIGS. 1A-1B, 2, and 3) and, at step 424, determining the value of the property of the by-product by the analyzer. A process (e.g., a material removal process, an etch process, a chamber cleaning process, among others) performed inside a substrate processing chamber may be, for example, a CVD, etch or cleaning process, among others, and such process is generally initiated by flowing reactants, etchants, or process gases into the substrate processing chamber. A PVD process is typically followed by sputtering a target. Depending on the process performed inside the substrate processing chamber, a plasma may also be used in a material removal process.

During an initial stage of a cleaning, etch, CVD, or PVD process, the amount of the by-product is close to zero, and the amounts of the by-products will increase as the process is performed within the substrate processing chamber. In general, any by-products, which are readily generated as soon as the process is initiated, can be used as the by-product to be monitored. For example, an analyzer can monitor the generation rate of the by-product in real-time while the analyzer is connected to a substrate processing chamber and keep a record on the increased amounts of the by-products (e.g., increased generation rate of the by-products as represented by the increased measurement values of a property of the by-products).

In one embodiment, a control system and/or an analyzer connected to the control system can be used to monitor the initial level of the by-products of the process reaction and keep a record on the increased levels of the by-products generated from a substrate processing chamber connected to the control system and/or the analyzer. In another embodiment, monitoring the levels of the generated by-products is concurrently performed while the process (e.g., an etch, cleaning, CVD, and PVD process, among others) is performed. The process described herein can be any etching processes, cleaning processes, chamber conditioning processes, CVD processes, PVD processes, ALD processes, and combinations thereof.

In another embodiment, an analyzer (e.g., the analyzer 530 in FIGS. 1A-1B, 2, and 3), which is capable of detecting a property of the by-product of the process, is connected to a substrate processing chamber to monitor the value of a property of the generated by-products. The analyzer may be any of the chemical monitoring systems known in the art to detect, monitor, and determine the amounts, levels, generation rates of a property of a chemical (e.g., various types of reaction by-products).

By-products of a material removal process may be any of noble and diatomic gases and they may be in the forms of gaseous or ionized phases. It was found that gases or ionized noble and diatomic gases are relatively easy to detect and monitor. For example, the by-products that can be used to detect the end point of a chamber cleaning or a substrate processing operation may be gaseous or ionized Ar, He, Xe, $N_2$, $O_2$, $H_2O$, OH, among others.

In one aspect, the types of the property of the by-products, which are generated during a material removal process and measured by the analyzer, may be optical density, electrical field, mass, fluorescence, plasma emission of the by-product, and combinations thereof. Exemplary analyzers include a gas analyzer, a residual gas analyzer (RGA), a mass spectrometer, a fluorescence analyzer, an RF detector, a quartz crystal sensor, and a sputtering sensor, among others.

In another aspect, depending on the types of the reaction by-products of a substrate processing operation, a suitable analyzer can be coupled to the substrate processing chamber. For example, when the by-product generated in the substrate processing space during the process performed inside the substrate processing chamber is water, optical densities of the ionized or gaseous water by-products can be detected.

Suitable analyzers are chosen to match the operation parameters of the substrate processing chambers. For example, if a process performed inside the substrate processing chamber is performed where the pressure in the chamber is in the range of 1 Torr to 100 Torrs, an analyzer that can detect a property of the by-product of interest at the same pressure range can be used. Other processes may require an operational pressure in the miliTorr range, such as 200 mTorr to 500 mTorr, and then a suitable analyzer that can operate at mTorr pressure ranges should be used. In one embodiment, one or more analyzers that can operate a pressure between 1 Torr and 15 psi and can be coupled to one or more substrate processing chambers in a multi-chamber processing system. The analyzer is designed to be very sensitive to be able to detect a value of the property of interest of a by-product at various percentage or ppb levels, and can be adapted to work at all kinds of pressure level for various CVD, PVD, ALD, chamber cleaning, and/or plasma assisted processes. Analyzers such as the Quantus HP100 Gas Analyzer supplied by Inficon, at Two Technology Place, East Syracuse, N.Y., can be used. One or more analyzers can be adapted to be coupled to any one of the process chambers described here and can be interchanged easily with another type of analyzers for monitoring the amount (or level) of various types of by-products generated inside various types of substrate processing chambers.

At step 430, the end point of a process (e.g., a chamber cleaning process, an etch process, a material removal process, etc.) performed inside a substrate processing chamber is detected when the amounts (or levels) of the generated by-product (e.g., the measured values of the property of the by-product) decreases below a threshold limit. In general, a maximum amount (or generation rate) of the reaction by-products of a material removal process is reached when the process reaction is close to its end point. Such maximum amount, level, or generation rate of the by-product can be measured, monitored, and observed during steps 410, 420, 422, 424 or via prior end point detection methods. Once the maximum amount of the by-product is reached, the amount of the by-product of a material removal process will start to decrease dramatically in a maximum decrease rate (e.g., a maximum drop of the by-product's detected amount within a period of time), indicating the end point (or completion) of the process.

In one example, a material layer having an oxide material (e.g., silicon oxide and other semiconductor materials) on the surface of a substrate may need to be removed in an oxide material removal process and the by-product during such oxide removal process is water. In this configuration, an endpoint detection method (e.g., the method 400 in FIG. 4) is performed and the property of the water by-product (e.g., optical density, electrical field, mass, fluorescence, and plasma emission, among others) may be monitored for determining the end point of the oxide material removal process. The oxide removal process performed inside a substrate processing chamber may be a silicon oxide removal process, a selective oxide removal process, a metal oxide removal process, and a silicon nitride removal process, among others. The substrate processing chamber may be an etch chamber, cleaning chamber, CVD chamber, PVD chamber, and ALD chamber, among others.

It is found that the detection of a process end point occurs when the amount (or level, concentration) of the by-product generated from the substrate processing chamber passes its maximum amount that can be detected and decreases below a threshold limit in a maximum decrease rate. The threshold limit (L) can be a limit set after statistical analyses of prior end point detection methods on similar material removal processes or instantaneously by the analyzer (or the control system) with built-in derivative analysis algorithm. In one embodiment, the threshold limit is determined, by performing a derivative analysis to determine the point in time when the amounts of the generated by-products decrease in a maximum decrease rate, which is the same time point when a maximum derivative value of $d[by\text{-}product]/d[t]$ is obtained.

Optionally, at step 432, a derivative analysis is performed on the measured values (or levels) of the property of the by-product. A derivative analysis is generally a mathematical calculation or algorithm performed manually or as a built-in software in the analyzer (or the control system of a substrate processing chamber). The decrease rate of the amount of the generated by-product can be measured by the rate of the decreased levels of the property of the by-product, which can be measured by the analyzer and a maximum derivative value of $d[by\text{-}product]/d[t]$ can be determined by the analyzer instantaneously (in real time). A derivative analysis can be very a useful in finding the point in time when the amount of the by-products diminishes the fastest, reaching a maximum decrease rate as represented by a maximum derivative value of $d[by\text{-}product]/d[t]$ (e.g., a negative derivative value if a decrease rate is analyzed). Thus, the amount of the by-product at the time point when the maximum derivative value of $d[by\text{-}product]/d[t]$ is obtained can be set as the threshold limit.

Next, at step 440, the presence of the by-products is monitored, even after the measured values of the property of the by-product decrease below a threshold limit and/or a maximum derivative value of $d[by\text{-}product]/d[t]$ is obtained. If there are no more by-products generated from a substrate processing space inside the substrate processing chamber, the method 400 is ended. If, however, there is still the presence of the by-products generated from a space inside the substrate processing chamber, the steps 420, 422, 424, 430, and, optionally, step 432, as shown as a feedback loop in FIG. 4, is performed continuously, if desired, until there are no more by-product generated.

Prior endpoint detection methods typically measured the surface of the substrate to confirm that a material had been deposited or a contaminant had been cleaned from the surface of a substrate or chamber walls. One drawback of these detection methods was that they generally damaged the surface of the substrate or interfered with patterning of the substrate surface. The measurements of various by-products by an analyzer (e.g., the analyzer 530) located outside a substrate processing chamber thereby avoids any damages or interference with or to the surface of the substrate. In addition, any concern about contamination or degradation of the chamber body (or chamber walls) or a chamber viewing window (e.g., the chamber viewing window 528) is avoided.

Another drawback of prior art endpoint detection methods is that prior methodology only used time as a process control parameter to approximate the process endpoint. Even after extensive testing and analysis, such prior methodology resulted in a statistical guide, with statistically understood "uncertainty" about the actual endpoint, not an actual direct instantaneous process measurement to determine the completion of a material removal process. The prior art methodology generates an educated guess, a well-reasoned and data supported guess, but a guess nevertheless.

The process endpoint prediction problem is even more difficult, and changes in processing time can be dramatically more different, if there are different thicknesses of a material layer or different layers of a material on the surface of the substrate with features thereon. In addition, it is also very difficult to choose a proper process end point time, which allows the process to remove a portion of a first material layer, but stops before removal of a second material layer and leaves some portion of the first material layer on the surface of the substrate or within features.

For example, when fabricating a semiconductor substrate or device using shallow trench isolation (STI) technology, the edge treatment of a STI structure quite often results in problematic degraded electrical performance of the fabricated device. The cause for such problem is usually the formation of undesirable divots on the edge of the STI structure. The effect of the problematic divots on device performance is severe and includes reduced device threshold voltage and reduced width of a device feature. In an STI structure where a portion of a gate oxide material is removed (or etched) from the surface of a substrate, the oxide removal (or etching) process needs to be stopped in time before beginning the step of growing another material on the surface of a substrate. If the oxide removal process proceeds too long, divots will form near the gate oxide material at the interface of the STI structure and the silicon substrate. Thus, it is critical to suppress divot formation during such a material removal process at a precise end point time when a desired thickness of the oxide material is removed.

The problem of divot formation is even more severe on patterned substrates with features, where a layer (or thin film) of a material is present in different thicknesses (or as different layers of a material) on different area of the surface of a substrate. A process to deposit, remove, or etch such a material layer over a surface of a substrate in a substrate processing chamber may result in more than one rate-limiting steps, with more than one process end points (e.g., an early end point, $EP_1$, to indicate the removal of a thinner layer of the material and another end point, $EP_2$, to indicate the removal of a thicker layer of the material).

Figure 5A:
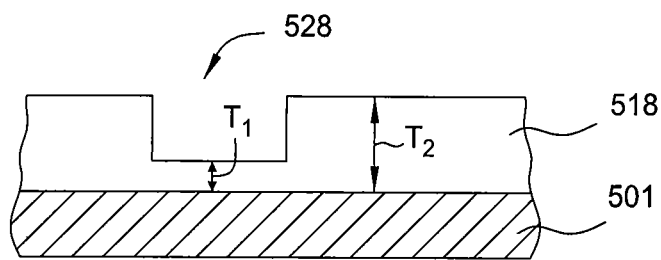
FIGS. 5A-5C illustrate one embodiment of an end point detection method in a process of removing a material layer having two or more different thicknesses covering different surface area of a surface of a substrate.
Figure 5B:
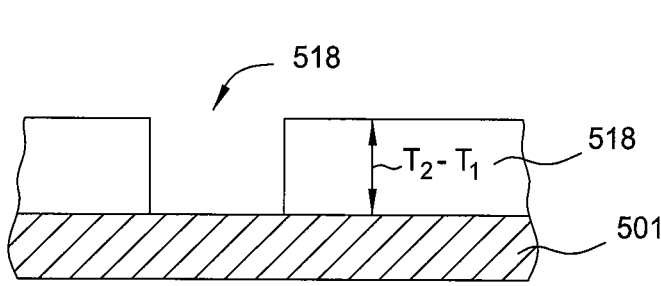
Figure 5C:

FIGS. 5A-5C illustrate the implementation of an end point detection method in a process of removing a material layer 518 having two or more different thicknesses, $T_1$ and $T_2$, covering different surface area over a surface of a substrate 501 (e.g., a patterned substrate having a total surface area, A). The material layer 518 may form into a feature 528 (e.g., a contact, via, hole, plug, line, and wire, among others) over the surface of a patterned substrate.

For example, as shown in FIG. 5A, the material layer 518 on the surface of the substrate 501 may have a thickness, $T_1$, covering an X % of the surface area, A, and a thickness, $T_2$, which is thicker than $T_1$, covering about Y % of the surface area, A. In a process to remove a portion of the material layer 518, a first end point, EP1, for the completion of the removal of a first thickness, $T_1$, of the material layer 518 can be observed around the time when the value of the property of the by-product decreases below a first threshold limit, (e.g., $L_1$). As a result, as shown in FIG. 5B, the surface of the substrate 501 may include the material layer 518 at a thickness of $T_2$-$T_1$, which covers about Y % of the surface area, A.

The first threshold limit, $L_1$, and the first end point, $EP_1$, can be determined by performing the method 400 of FIG. 4 (e.g., performing the steps 410, 420, 422, 424, 430, 432). Optionally, the step 434 is performed and the first threshold limit, $L_1$, is determined when a first maximum derivative value of the value of the property of the by-product is reached.

Next, a second end point, $EP_2$, for the complete removal of the material layer 518 from the surface of the substrate 501 can be observed around the time when the value of the property of the by-product decreases below a second threshold limit, $L_2$. In a process to remove a material layer with two different thicknesses, where the second thickness is initially thicker than the first thickness, the amount of the by-product of the process is decreased to below the second threshold limit at the second end point, $EP_2$, when the material layer is completely removed from the surface of the substrate. As shown in FIG. 5C, at $EP_2$, the material layer 518 is completely removed from the surface of the substrate 501.

The second threshold limit, $L_2$, and the second end point, $EP_2$, can be determined by performing the method 400 of FIG. 4 (e.g., performing the steps 420, 422, 424, 430, 432, 434 after performing the step 440 in the feedback loop of FIG. 4). Optionally, a derivative analysis is performed and the second threshold limit, $L_2$, is determined when a second maximum derivative value of the value of the property of the by-product is reached.

One advantage of monitoring the increased levels and maximum decrease rates of the generated by-products to determine a process endpoint is that the endpoint detection method can be performed in real time, e.g., while a cleaning, etch, CVD, PVD process is performed inside the substrate processing chamber and concurrently at the time when the by-product of the process is generated. A process can be controllably terminated once an end point is detected. There is no need for a pre-set (predicted—guess based) process time. In addition, there is no concern about the disadvantages of the prior art process end point methods which have the drawbacks, such as damaging features on the substrate surface, uneven material removal, undesirably divot formation on the surface of a substrate structure, or contamination inside the chamber.

By directing a flow of the generated by-products out of the substrate processing chamber and directed to an analyzer (e.g., the analyzer 530) coupled to a substrate processing chamber, the value of a property of the by-product can be analyzed by an analyzer (e.g., the analyzer 530) and recorded by the analyzer and/or the control system of the substrate processing chamber. Once the end point of the process is detected, the control system can automatically terminate the process performed inside the substrate processing chamber, thereby improving process efficiency and increasing the throughput of a substrate processing system.

Figure 6:
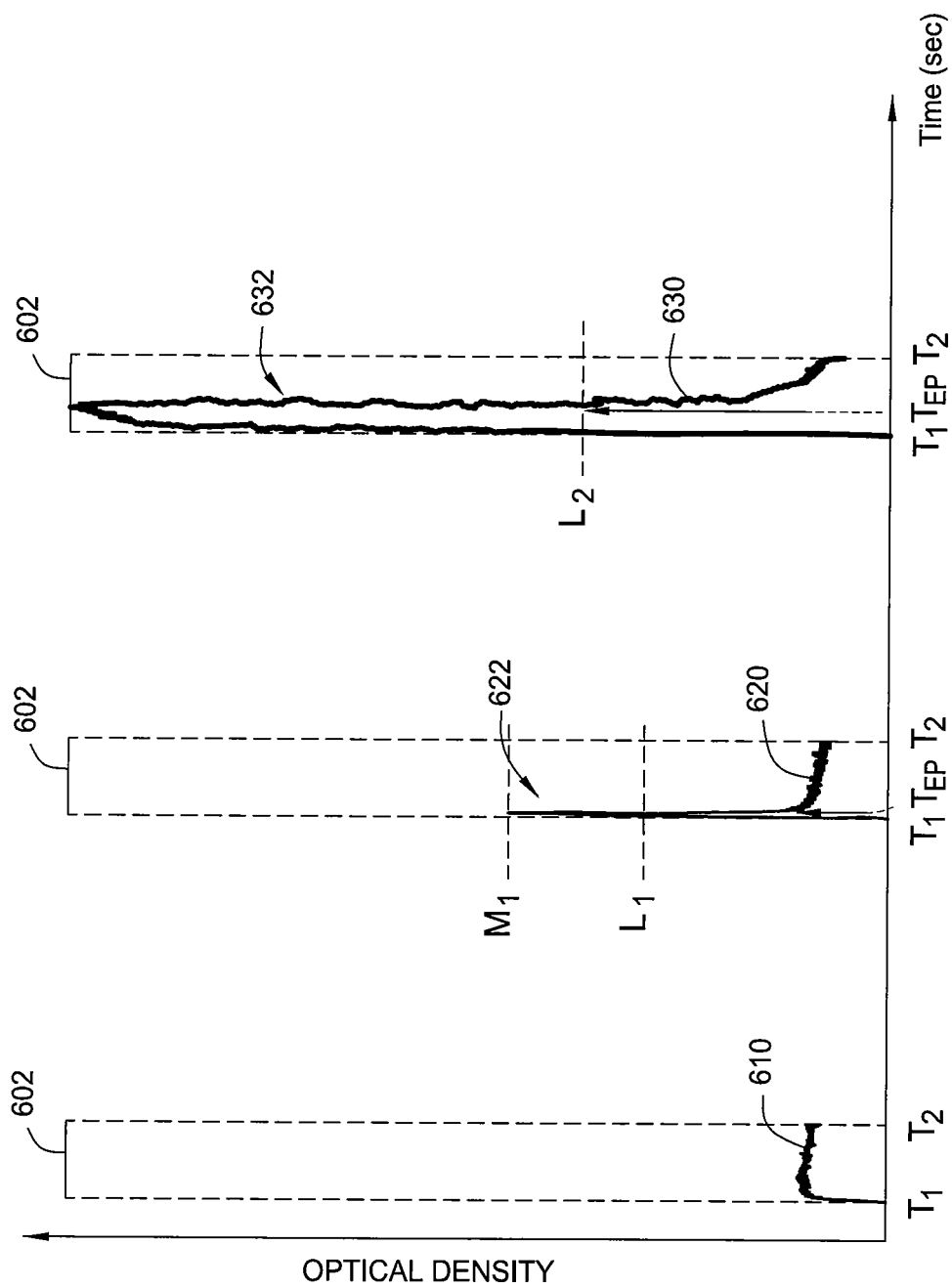
FIG. 6 illustrates three plots of the results of a method of analyzing an end point of a process performed inside a substrate processing chamber.

One embodiment provides end point detection of selective removal of a material layer with different film thickness on different surface sections, or covering different percentage of the surface area, on the surface of the substrate. The material layer to be removed from the surface of the substrate may contain silicon, silicon oxide, silicon nitride, metal oxide, and other materials. For example, the material layer may have a first thickness on a first percentage of the substrate surface area and a second thickness on a second percentage of the substrate surface area. The second thickness may be thicker than the first thickness and may be from about 1 Å (angstrom) to about 5000 Å. Accordingly, during a material removal process inside a substrate processing chamber, the end point for the complete removal of the first thickness of the material layer from the first percentage of the substrate surface area can be monitored and detected at a first time point $T_{EP1}$ before the complete removal of the material layer from the second percentage of the substrate surface area at a second time point $T_{EP2}$. FIGS. 6 and 7A-7B illustrate examples of graphical plots of the detection of the process end points for such a selective material removal process.

EXAMPLE 1

Removal of a Native Oxide Material from the Surface of a Substrate or a Chamber Body In one example, an oxide etching process may be performed to remove a silicon oxide material or a native oxide material (the oxide that forms from exposure to normal atmosphere on a silicon or other reactive material surface) from the surface of a substrate. Such a process can also be used to clean or condition the chamber and remove an oxide containing material from the chamber walls, chamber body, substrate support surface and other area inside the chamber.

The oxide etching process or oxide removal process described herein is also suitable for selective material removal. Examples of selective material removal (the removal of materials reactive to one etching/removal agent while other surrounding materials are not reacting and not being removed) includes, for example, removal of a material having different thicknesses in different surface area of the surface of a substrate, or removal of different materials (both of which are reactive to the removal agent) that cover different percentage of the surface area over the substrate surface.

In one example, an oxide-containing material on the substrate surface in a first percentage of the total substrate surface area has a first thickness (e.g., $T_1$ in FIG. 5A) and a second percentage of the total substrate surface area has a second thickness (e.g., $T_2$ in FIG. 5A), thicker than the first thickness. In this example, the method and apparatus described can detect the first oxide removal end point (e.g., $EP_1$ as discussed above), when removal of the oxide-containing material over the first percentage of the total substrate surface area is removed. Such a selective oxide removal process can be stopped once the first oxide removal process end point is detected, so that further removal of the oxide-containing material from the second percentage of the total substrate surface area initially having the second thickness (thicker than the first thickness) can be avoided. As material is generally uniformly removed from the surface of a substrate, the removal of a material thickness equal to thickness of the first thickness covering the first percentage of the total substrate surface area can be said to selectively remove the material from the first percentage of the surface area, while still leaving some material over the substrate surface covering the second percentage of the total substrate surface area, albeit reduced in thickness from what it was initially at the start of the removal process. The end point of the removal process of the oxide-containing material from the first surface area of the substrate is detected by identifying when the value of a property of the water by-product decreases (or falls) below a monitored maximum level (e.g., below a threshold limit where a maximum decrease rate occurs).

Exemplary substrates may have a gate structure formed thereon during different stages of fabricating a silicide layer or a metal silicide layer on the gate structure. The substrate may include a gate structure, source and drain regions formed adjacent to the gate structure. The gate structure may further include a gate electrode disposed on a gate dielectric. A spacer liner may be formed adjacent to the gate structure surrounded by a spacer dielectric.

The dielectric layer may be a dielectric material selected from a group consisting of an oxide layer, a nitride layer, titanium nitride layer, a composite of oxide and nitride layer, at least one or more oxide layers sandwiching a nitride layer, and combinations thereof, among others. The gate electrode layer may be a polysilicon layer, a doped silicon layer, or other suitable silicon containing material. Alternatively, the gate electrode layer may be a composite film including a polysilicon layer disposed on a metal material. The source and drain region may be manufactured in doped polysilicon material, such as n-type or p-type doped monocrystalline silicon. The space liner and the spacer dielectric may also be fabricated from a dielectric material selected from a group consisting of an oxide layer, a nitride layer, metal nitride layer, a composite of oxide and nitride layer, or among others.

During substrate processing, the substrate may be subjected to oxidative conditions which may adversely increase likelihood of growing native oxides and be the source of contaminants on the chamber body or other impurities and contaminants formed on the surfaces of the gate structure, and the source and drain regions formed on the substrate. As the materials used to fabricate the gate structure and the source and drain are mostly silicon, a layer of native oxide (such as silicon oxide or silicon oxide containing material) may be formed on the substrate surfaces. Native oxide formed on the gate structure and the source and drain region of the substrate may increase the electrical resistance of the semiconducting material, and adversely affect the electrical conductivity of the subsequently deposited metal silicide layer. Therefore, it is desirable to remove the native oxide prior to depositing (or forming) the metal silicide layer or other metal conductors used to interconnect active electronic elements on or within a substrate.

The oxide removal process may use etching gasses, such as a mixture of ammonia ($NH_3$) and nitrogen trifluoride ($NF_3$) gases. The amount of each gas introduced into the processing chamber is varied and adjusted to accommodate, for example, the thickness of the native oxide layer to be removed, the geometry of the substrate being cleaned, the volume capacity of the plasma, the volume capacity of the chamber body, as well as the capabilities of the vacuum system coupled to the chamber body. An RF source power supplying a power of about 200 Watts to about 600 Watts is applied to maintain a plasma inside the substrate processing chamber 100.

A purge gas or carrier gas can be added to the gas mixture. Any suitable purge/carrier gas can be used, such as argon, helium, hydrogen, nitrogen, or mixtures thereof. An overall cleaning gas mixture has from about 0.05% to about 20% by volume of ammonia and nitrogen trifluoride. The remainder of the gas mixture may be the purge/carrier gas. In one embodiment, the purge/carrier gas is first introduced into the chamber body 112 before the reactive etchant gases (i.e., $NF_3$ and $NH_3$) to stabilize the pressure within the chamber body 112.

A process pressure in the processing chamber 100 is generally regulated between about 100 mTorr and about 5000 mTorr, and more closely between about 300 mTorr and about 3000 mTorr, with a general initial setting or target pressure of about 2000 mTorr. The gasses supplied in the gas mixture may be controlled to flow into the chamber at a rate between about 200 sccm and about 5000 sccm and the inert gas supplied in the gas mixture may be controlled to flow into the chamber at a rate between about 200 sccm and about 5000 sccm. The substrate temperature is maintained at between about 25 degrees Celsius and about 300 degrees Celsius.

The oxide removal process thus undergo a series of reactions, including:

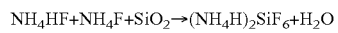

The plasma energy dissociates the ammonia and nitrogen trifluoride gases into reactive species (e.g. fluorine radicals and/or hydrogen radicals), which in turn combine to form a highly reactive ammonia fluoride ($NH_4F$) compound and/or ammonium hydrogen fluoride ($NH_4F\cdot HF$) in the gas phase, which then act on the substrate surface to be cleaned. A purge/carrier gas can be used to assist and/or facilitate the delivery of the reactive species to the substrate.

The reaction by-products of such an oxide removal process include $NH_4HF$, $NH_4F$, $(NH_4)_2SiF_6$, $H_2O$, among others. These reaction by-products may be in gaseous phase or vapor. In this example, the amount of the water by-product detected can be used as a signal indicator for end point detection and the level (or amount, level) of a property of the water by-product produced can easily be measured. For example, the amount of the water by-product as represented by the value of the optical density property of the water vapor generated from the substrate processing chamber can be measured and monitored by a gas analyzer.

FIG. 6 shows the comparison of various exemplary oxide removal processes. The magnitude (or level or amount or measured value) of a property (e.g., optical density) of a by-product of a material removal process measured by the analyzer 530 is represented on the vertical axis of the graphs as a signal is plotted against reaction time (in seconds) on the horizontal axis to provide data to determine process end point conditions. In the first plot on the left, RF plasma was on (applied) from $T_A$ to $T_B$, as indicated by a plasma-on duration time line 602. The left plot of FIG. 6 presents a base line (or process control) of an oxide removal process on a silicon-containing blanket wafer substrate and the result is shown as a plotted curve 610. The amount of water by-product is measured by the value of the optical density of water vapor (e.g., the optical density of vaporized $OH^-$ ions) from the time period $T_A$ to $T_B$. The plotted curve 610 exhibits a steady base line, with no increased level of the water by-product over time, and provides a base line (control) level (amount) against which processes performed subsequently on other wafer substrates may be measured and compared.

FIG. 6 also includes a center plot containing a plotted curve 620, illustrating detected generation of a water by-product, as measured by the value of the optical density of water vapor from the time period $T_A$ to $T_B$, for a process where a native oxide material is removed from a wafer substrate. The level of water signal increases with time and a maximum observed level (e.g., a sharp peak of a maximum observed level, $M_1$, on the plotted curve 620) is detected. Arrow 622 (see the horizontal axis of the center plot) exhibits a fast decrease in the water by-product level, representing the time at which a process end point is detected. It is the time point when the amount of the water by-product measured decreases sharply (e.g., decreasing in a maximum decrease rate) below a threshold limit, $L_1$, which is detected after the maximum observed level, $M_1$. Accordingly, $T_{EP}$ indicates the point in time when the end point of the native oxide removal process is detected and the process inside the substrate processing chamber can be terminated.

EXAMPLE 2

Removal of a Pad Oxide Material

During substrate fabrication, a pad oxide material layer formed on a small portion of the surface of a gate structure is generally required to be etched and removed before depositing the next material layer. On a typical patterned wafer substrate surface, the surface area of the pad oxide material layer is relatively small such that these pad oxide materials are difficult to etch and remove without formation of undesirable divot structures.

An oxide removal process is used to etch a pad oxide material from the surface of the substrate prior to depositing a gate oxide layer. The etching process may use etching gasses, such as a mixture of ammonia ($NH_3$) and nitrogen trifluoride ($NF_3$) gases. Factors which need to be considered in establishing the duration of the ideal etch process time include: the thickness of the gate oxide layer to be removed, the geometry of the substrate being cleaned, the volume capacity of the plasma, the volume capacity of the chamber body, as well as the capabilities of the vacuum system coupled to the chamber body. These factors are taken into account when adjusting a processing time. An RF source power is applied to maintain a plasma in the gas mixture. A power of about 200 Watts to about 600 Watts may be applied to maintain a plasma inside the substrate processing chamber 100. Purge gas or carrier gas can also be added to the gas mixture. A process pressure in the processing chamber 100 is regulated between about 100 mTorr and about 5000 mTorr, and more narrowly such as between about 300 mTorr and about 3000 mTorr. The gasses supplied in the gas mixture are controlled to flow into the chamber at a rate between about 200 sccm to about 5000 sccm and the inert gas supplied in the gas mixture is controlled to flow at a rate between about 200 sccm and about 5000 sccm. Substrate temperature is maintained between about 25 degrees Celsius and about 300 degrees Celsius.

The gate oxide etching process thus undergo a series of reactions, including:

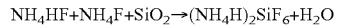

The reaction by-products of such a gate oxide etching process include $NH_4HF$, $NH_4F$, $(NH_4H)_2SiF_6$, $H_2O$, among others. These reaction by-products may be in gaseous phase or vapor. In this example, the amount of the water by-product flowing from the process chamber to an analyzer can be used as a signal guide for end point detection because the amount and generation rate of the water vapor by-product can easily be measured. For example, the level of a flow of the water vapor directed to an analyzer can be measured and the optical density property of the water vapor generated from the substrate processing chamber can be monitored.

The right side of FIG. 6 further illustrates such an example of a gate oxide etching process. The levels of a property of water by-product during an etching process performed inside the substrate processing chamber 100 can be monitored by the analyzer 530 and plotted against time (in seconds). RF plasma was on from $T_A$ to $T_B$, as indicated by a plasma-on duration time line 602.

A gate oxide material layer having a thickness of from about 10 Å (angstrom) to about 5000 Å, with a typical thickness of about 100 Å, is etched and removed from the surface of a substrate by the etching process described herein inside the substrate processing chamber 100. One example of the results of such a gate oxide material removal process is shown as a plotted curve 630.

In the plotted curve 630, the water by-product formed near a substrate processing space above the substrate support pedestal is subjected to an end point detection method for about 5 seconds to about 5 minutes to remove the oxide material from the surface of the substrate, depending on the operating temperature, pressure and flow rate of the gas. The oxide removal process is performed by supplying an etching gas mixture into the processing chamber 100 to form a plasma from the gas mixture to remove the oxide material. For example, the substrate is typically processed for about 30 seconds to about 90 seconds. In an exemplary embodiment, the substrate is exposed for about 90 seconds or less. The operating pressure within the chamber can vary. Pressure is maintained between about 1 Torr and about 10 Torr. An RF source power is applied to maintain a plasma of the gas mixture. Power of about 15 Watts to about 100 Watts is applied to maintain a plasma inside the processing chamber 100. The frequency at which the power is applied is around 350 kHz. The frequency can range from about 50 kHz to about 350 kHz.

A review of the plotted curve 630 reveals that the levels of the water by-product, as measured by the optical density values of the water vapor, increased over time and a sharp peak of a maximum observed level, $M_2$, was detected. Arrow 632, representing the time at which a process end point is detected, exhibits a fast decrease in the optical density value of the water by-product, and correspond to $T_{EP}$ (on the horizontal axis), the point in time when the end point of the gate oxide etching process is detected and the process inside the substrate processing chamber can be terminated. $T_{EP}$ is the time point when the amount of the water by-product measured decreases sharply (e.g., decreasing in a maximum decrease rate) below a threshold limit, $L_2$, which is detected after the maximum observed level, $M_2$.

A control system connected to a substrate processing system can be used to perform real-time (instantaneous or near instantaneous) monitoring of the detected amount of the water vapor by-product, as measured by the optical density property of the water by-product, and terminate the gate oxide removal process performed inside the substrate processing system. Accordingly, $T_E$ indicated the time point when the end point of the gate oxide etching process is detected and the process inside the substrate processing chamber can be terminated.

EXAMPLE 3

Removal of a Copper Oxide Material During Chamber Conditioning

Before or after a copper deposition process inside a substrate processing chamber, it is desired to remove a copper oxide material from the substrate processing chamber so that the chamber can be ready for use with the copper oxide material initially absent from the chamber. A hydrogen gas ($H_2$) is delivered into the chamber and a plasma is ignited to generate a hydrogen-containing plasma and clean and condition the chamber.

A chamber conditioning process or a metal material removal process is used to remove a copper oxide material from the surface of the chamber walls, substrate susceptor, and various portions of the chambers, before depositing a metal layer, such as a copper layer. In one embodiment, the metal material removal process may be a process used to remove a metal layer that contains a material including copper, tungsten, titanium, cobalt, nickel, tantalum, palladium, platinum or combinations thereof.

The chamber conditioning process may use a mixture of gasses, such as a mixture of hydrogen ($H_2$) with carrier gas or other inert gases. An RF source power may be applied to maintain a plasma in the gas mixture. For example, a power of about 200 Watts to about 600 Watts is applied to maintain a plasma inside the substrate processing chamber 100. A process pressure in the substrate processing chamber 100 is regulated between about 100 mTorr and about 5000 mTorr. The gasses supplied in the gas mixture are controlled to flow into the chamber at a rate between about 200 sccm to about 5000 sccm and the inert gas supplied in the gas mixture is controlled to flow at a rate between about 200 sccm and about 5000 sccm. Substrate temperature is maintained between about 25 degrees Celsius to about 300 degrees Celsius.

The copper oxide removal process thus undergo a series of reactions, including:

$Cu_2O + CuO + H2$ (in plasma) $\rightarrow Cu + H_2O$

The reaction by-products of such a copper oxide etching process include copper, and $H_2O$, among others. These reaction by-products may be in gaseous phase or vapor. In this example, the amount of the generated water by-product can be used as a guide for end point detection and the level of water by-product (e.g., the optical density property of the water by-product) can easily be measured. Thus, it is useful to monitor the value of a property of the $H_2O$ by-product signal, such as the level of the optical density of the water vapor, produced inside the chamber to detect the end point of the copper oxide removal process inside the substrate processing chamber.

A flow of gaseous water vapor can be directed to an analyzer (e.g., a gas analyzer) connected to the substrate processing chamber and the values of the optical density of the water vapor generated from the substrate processing chamber can be measured and monitored by the analyzer. As another example, the flow of the water by-product signal can be detected by a mass spectrometer. The water by-product flow can also be measured by the level of fluorescence that is excited by plasma (e.g., a high frequency plasma, or microwave plasma, etc.).

Measuring the level the water vapor by-product (as represented by the value of a property of the by-product) occurs while the copper oxide removal process is being performed. A control system connected to the substrate processing system is used to perform the real-time monitoring of a property of the water vapor by-product and terminate the copper oxide removal process performed inside the substrate processing chamber. Once the water vapor level is dropped from a threshold level, L, an end point in time ($T_{EP}$) can be detected to indicate the completion of the copper oxide removal process.

EXAMPLE 4

Removal a Silicon Oxide Material layer in Different Thicknesses to Cover Different Surface Area of a Substrate Surface During substrate fabrication of a typical patterned wafer substrate, the surface area of the lines and features thereon is relatively small. It is often required to remove an oxide material layer with different thicknesses at different small portions of the substrate surface before the next substrate fabrication operations. The oxide material removal process has to be precisely terminated to avoid damaging the underlying layer at different surface area covering small lines and features. For example, a gate structure with silicon-containing pad oxide materials is difficult to etch and remove without over-etching and thereby creating or forming undesirable divot structures in the underlying layer.

An oxide removal process is used to etch a pad oxide material from the surface of the substrate prior to depositing a gate oxide layer. The oxide removal process may use etching gasses, such as a mixture of ammonia ($NH_3$) and nitrogen trifluoride ($NF_3$) gases to remove the silicon oxide-containing gate oxide layer inside the substrate processing chamber 100 with one or more coupled analyzers 530. The gasses supplied in the gas mixture are controlled to flow into the chamber at a rate between about 200 sccm and about 5000 sccm and the inert gas supplied in the gas mixture is controlled to flow at a rate between about 200 sccm and about 5000 sccm. A RF source power is applied to maintain a plasma in the gas mixture. Purge gas or carrier gas can be added to the gas mixture. The process pressure and temperature inside the substrate processing chamber 100 is regulated. Substrate temperature is maintained between about 25 degrees Celsius and about 300 degrees Celsius.

The reaction by-products of such a gate oxide etching process include $NH_4HF$, $NH_4F$, $(NH_4H)_2SiF_6$, $H_2O$, among others. Such reaction by-products may be in gaseous phase or vapor. In this example, the water by-product flow can be used as a guide for end point detection and the level of water by-product flow can easily be measured. For example, the level of the water vapor flow can be measured by a gas analyzer and the optical density property of the water vapor generated from the substrate processing chamber is monitored.

FIG. 7A shows the results of detecting process end points of three exemplary gate oxide etching processes. FIG. 7B shows three exemplary plots of performing a derivative analysis on the values of the optical densities of the by-product obtained from performing the processes of FIG. 7B.

In FIG. 7A, the values of a property (e.g., optical density) of water by-products are plotted versus processing time (in seconds), where a gate oxide etching process is performed inside an etch chamber on a substrate containing two different thicknesses of a silicon dioxide material layer covering two surface area portions (in two different percentages of the total surface area). The silicon oxide etching process is performed by supplying an etching gas mixture into the etch chamber to form a plasma from the gas mixture and remove the silicon oxide material. RF plasma was on (applied) from $T_A$ to $T_B$, as indicated by a plasma-on duration time line 602.

The left plot of FIG. 7A presents a plotted curve 710 for etching a silicon oxide material layer at a first thickness, $T_1$, of about 130 to 140 Å, covering 10% of the total substrate surface area, and at a second thickness, $T_2$, of about 200 Å, covering the rest of 90% of the total substrate surface area, from the surface of the substrate.

The center plot of FIG. 7A presents a plotted curve 720 for etching a silicon oxide material layer at a first thickness, $T_1$, of about 130 to 140 Å, covering 20% of the total substrate surface area, and at a second thickness, $T_2$, of about 200 Å, covering the rest of 80% of the total substrate surface area, from the surface of the substrate.

The right plot of FIG. 7A presents a plotted curve 730 for etching a silicon oxide material layer at a first thickness, $T_1$, of about 70 Å, covering 10% of the total substrate surface area, and at a second thickness, $T_2$, of about 100 Å, covering the rest of 90% of the total substrate surface area, from the surface of the substrate.

In the plotted curves 710, 720, and 730 of FIG. 7A, the water by-products formed near a substrate processing space above the substrate support pedestal are monitored and the amounts of the water by-products increase over time. Maximum levels, $M_1$, $M_2$, and $M_3$, of a flow of the water by-product directed to an analyzer are detected.

After the maximum levels, $M_1$, $M_2$, and $M_3$, are detected, the amounts of the water by-products, as represented by the measured values of the optical density property of the water by-products, decrease sharply. The rate of such sharp decrease in the levels of the water by-products is better observed after performing a derivative analysis and the results are shown in FIG. 7B. Such a derivative analysis performed on the measured values of the optical density property of the water by-products can be done in real-time, while the levels of the water by-products generated from the etch chamber is monitored. After performing a derivative analysis on the plotted curves 710, 720, and 730 of FIG. 7A, the resulting plots are shown as plotted curves $710D_1$, $720D_1$, and $730D_1$ in FIG. 7B.

In FIG. 7B, each negative derivative value (d[by-products]/dt) as shown in the plotted curves $710D_1$, $720D_1$, and $730D_1$ represents the "decrease" rate of the water by-product at each time point. The negative values can be converted into positive values, resulting in plotted curves $710D_2$, $720D_2$, and $730D_2$ in FIG. 7B.

In FIG. 7B, the plotted curve $710D_1$ shows two peaks maximum derivative values $712D_1$ and $714D_1$. A review of the plotted curves $710D_2$, $720D_2$, and $730D_2$ reveals at least two end points in time, $T_{EP1}$ and $T_{EP2}$, when maximum decrease rates of the amounts of the by-product in each curve, maximum derivative values $712D_1$ and $714D_1$ in the plotted curve $710D_1$, maximum derivative values $722D_1$ and $724D_1$ in the plotted curve $720D_1$, and maximum derivative values $732D_1$ and $734D_1$ in the plotted curve $730D_1$.

$T_{EP1}$ represents the end point in time when the first thickness of the silicon oxide material is removed from the surface of the substrate, which corresponds to arrows 712, 722, and 732 in the plotted curves 710, 720, and 730, respectively, in FIG. 7A. $T_{EP2}$ represents the end point in time when all 100% of the silicon oxide material is removed from the surface of the substrate, which corresponds to arrows 714, 724, and 724 in the plotted curves 710, 720, and 730, respectively, in FIG. 7A.

The detected maximum derivative values as detected in FIG. 7B can be used to determine to each end point in time, $T_{EP}$, and further back to FIG. 7A to determine the threshold levels, L, for the measured values of the optical density property of the water by-product at such process endpoints. For example, in the plotted curve 710, the values of the optical density property of the water by-product at $T_{EP1}$ and $T_{EP2}$ are found to be roughly at around threshold levels, $L_3$ and $L_4$. In the plotted curve 720, the threshold levels of the optical density property of the water by-product at $T_{EP1}$ and $T_{EP2}$ are found to be roughly at around, $L_5$ and $L_6$. In the plotted curve 730, the threshold levels of the optical density property of the water by-product at $T_{EP1}$ and $T_{EP2}$ are found to be roughly at around, $L_7$ and $L_8$.

In practice, the etching process progresses across the full surface of the substrate and a selective etching process can be stopped in time at a first time point of $T_{EP1}$, when the first end point sensing of the removal of the first thickness, $T_1$, of the silicon oxide material is detected, leaving still the rest of the oxide material, at a thickness $T_2$-$T_1$, over a portion of the substrate surface.

In FIG. 7A, the threshold level, $L_3$, $L_5$, or $L_7$, at $T_{EP1}$ is critical, because this is the detected by-product level at the point in time where a selective etching process can be stopped in time and only a first thickness of the silicon oxide material is removed from the surface of the substrate.

It is found that ratio of the threshold level, $L_3$, to the maximum level, $M_3$, roughly correspond to the percentage of the first thickness of the silicon oxide material over the surface of the substrate; in the example of the plotted curve 710, the ratio of $L_3/M_3$ is about 10%, which corresponds to the 10% of the surface area over the total substrate surface, where the silicon oxide material is at the first thickness $T_1$, of about 130 to 140 Å. Therefore, the left plot of FIG. 7A represents the results of detecting the process end point, $T_{EP1}$, by monitoring the amount of the by-products below the threshold level, $L_3$, during a process of removing a material from even only about 10% of the surface area of a substrate, a very small portion of the substrate surface.

The described method and apparatus provide the advantage of being able to detect the removal of native oxides or other oxide containing materials from small surface areas (portions) of the substrate surface by utilizing an analyzer to detect byproduct flow rata to detect the end point of a particular material removal process.

Efficient removal of the native oxides or oxide containing material from the substrate surface can be detected and terminated when the magnitude of the flow of the water by-product falls below a threshold level after reaching a maximum level. In one embodiment, the magnitude (level) of the property of the water vapor by-product is detected, passing a monitored maximum level and below the threshold level, while the oxide removal process is performed inside a substrate processing chamber.

While the foregoing is directed to embodiments according to the present invention, other and further embodiments can be devised without departing from the basic scope thereof, and the scope thereof is determined by the claims that follow.

The invention claimed is:

1. A method for analyzing an end point of a process performed inside a substrate processing chamber, comprising:
   performing the process to remove a material from an interior portion of the substrate processing chamber, wherein the process generates a by-product;
   detecting the generation of the by-product in the interior portion of the substrate processing chamber concurrently while the process is being performed, wherein the by-product generated in the interior portion of the substrate processing chamber is in the form of an ionized or gaseous phase having an optical density, wherein the by-product is water;
   directing a flow of the by-product into a pressure cavity near a substrate processing space above a support pedestal, wherein the pressure cavity is connected to an analyzer;
   monitoring a value of a property of the by-product by the analyzer; and
   determining an end point of the process when the value of the property of the by-product decreases below a threshold limit.

2. The method of claim 1, wherein the threshold limit is determined when a maximum derivative value of the value of the property of the by-product is reached.

3. The method of claim 1, wherein the analyzer is capable of determining and monitoring the value of the property of the by-product, and the property is selected from the group consisting of optical density, electrical field, mass, fluorescence, plasma emission, and combinations thereof.

4. The method of claim 3, wherein the value of the property of the by-product is determined by the analyzer concurrently while the process is performed inside the substrate processing chamber and the by-product is generated.

5. The method of claim 1, wherein the substrate processing chamber is selected from the group consisting of etch chambers, cleaning chambers, CVD chambers, PVD chambers, ALD chambers, and combinations thereof.

6. The method of claim 1, wherein the process performed within the substrate processing chamber is selected from the group consisting of etching processes, cleaning processes, chamber conditioning processes, CVD processes, PVD processes, ALD processes, and combinations thereof.

7. The method of claim 1, wherein the material is selected from the group consisting of silicon, silicon oxide, silicon nitride, metal oxide, and combinations thereof.

8. The method of claim 1, wherein the pressure level within the pressure cavity is above 1 Torr.

9. A method for analyzing an end point of an etching process performed inside an etch chamber, comprising:
   performing the etching process to remove a material from a surface of a substrate disposed above a support pedestal of the etch chamber, wherein the etch process generates a by-product;
   detecting the generation of the by-product in an interior portion of the etch chamber concurrently while the etching process is being performed, wherein the by-product generated in the interior portion of the etch chamber is in an ionized or gaseous phase having an optical density which is monitored;
   directing a flow of the by-product into a pressure cavity near a substrate processing space above the support pedestal, wherein the pressure cavity is connected to an analyzer;
   monitoring a value of a property of the by-product by the analyzer; and
   determining the end point of the etching process when the value of the property of the by-product decreases below a threshold limit.

10. The method of claim 9, wherein the pressure level within the pressure cavity is above 1 Torr.

11. The method of claim 9, wherein the threshold limit is determined when a maximum derivative value of the value of the property of the by-product is reached.

12. The method of claim 9, wherein the by-product is water.

13. The method of claim 9, wherein the value of the property of the by-product is determined by the analyzer concurrently while performing the etching process inside the etching chamber to generate the by-product.

14. The method of claim 13, wherein the analyzer is capable of determining a property of the by-product, and the property is selected from the group consisting of optical density, electrical field, mass, fluorescence, plasma emission, and combinations thereof.

15. A method for analyzing an end point of an oxide removal process performed inside a substrate processing chamber, comprising:
   performing the oxide removal process to remove an oxide-containing material layer from a surface of a substrate disposed above a support pedestal of the substrate processing chamber, wherein the oxide removal process generates a water by-product;
   detecting the water by-product in an interior portion of the substrate processing chamber concurrently while the oxide removal process is being performed;
   directing a flow of the water by-product into a pressure cavity near a substrate processing space above the support pedestal;
   monitoring a value of a property of the water by-product generated during the oxide removal process; and
   determining a first end point for the completion of the removal of a first thickness of the oxide-containing material layer when the value of the property of the water by-product decreases below a first threshold limit and the first thickness of the oxide-containing material layer is completely removed from the surface of the substrate.

16. The method of claim 15, wherein the first threshold limit is determined when a first maximum derivative value of the value of the property of the water by-product is reached.

17. The method of claim 15, wherein the flow of the water byproduct is directed to an analyzer coupled to a pressure cavity of the substrate processing chamber and the value of the property of the water by-product is determined by the analyzer concurrently while performing the oxide-removal process inside the substrate processing chamber.

18. The method of claim 15, wherein the oxide removal process is selected from the group consisting of silicon oxide removal processes, selective oxide removal processes, metal oxide removal processes, silicon nitride removal processes, and combinations thereof.

19. The method of claim 15, wherein the substrate processing chamber is selected from the group consisting of etch chambers, cleaning chambers, CVD chambers, PVD chambers, ALD chambers, and combinations thereof.

20. The method of claim 15, further comprising:
determining a second end point for the completion of the removal of a second thickness of the oxide-containing material layer when the value of the property of the water by-product decreases below a second threshold limit and the second thickness of the oxide-containing material layer is completely removed from the surface of the substrate, wherein the second thickness is initially thicker than the first thickness.

21. The method of claim 20, wherein the second threshold limit is determined when a second maximum derivative value of the value of the property of the water by-product is reached.

22. The method of claim 15, wherein the pressure level within the pressure cavity is above 1 Torr.

23. A method for analyzing an end point of a process performed inside a substrate processing chamber, comprising:
performing the process to remove a material from an interior portion of the substrate processing chamber, wherein the process generates a by-product;
detecting the generation of the by-product in the interior portion of the substrate processing chamber concurrently while the process is being performed;
directing a flow of the by-product into a pressure cavity near a substrate processing space above a support pedestal, wherein the pressure cavity is connected to an analyzer;
monitoring a value of a property of the by-product by the analyzer; and
determining an end point of the process when the value of the property of the by-product decreases below a threshold limit, wherein the by-product is water.

24. A method for analyzing an end point of an etching process performed inside an etch chamber, comprising:
performing the etching process to remove a material from a surface of a substrate disposed above a support pedestal of the etch chamber, wherein the etch process generates a by-product;
detecting the generation of the by-product in an interior portion of the etch chamber concurrently while the etching process is being performed;
directing a flow of the by-product into a pressure cavity near a substrate processing space above the support pedestal, wherein the pressure cavity is connected to an analyzer;
monitoring a value of a property of the by-product by the analyzer; and
determining the end point of the etching process when the value of the property of the by-product decreases below a threshold limit, wherein the by-product is water.

* * * * *